US012219831B2

(12) United States Patent
Jeong et al.

(10) Patent No.: US 12,219,831 B2
(45) Date of Patent: Feb. 4, 2025

(54) DISPLAY APPARATUS

(71) Applicant: Samsung Display Co., Ltd., Yongin-si (KR)

(72) Inventors: Changwon Jeong, Yongin-si (KR); Wonmi Hwang, Yongin-si (KR); Geurim Lee, Yongin-si (KR); Jaewon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 211 days.

(21) Appl. No.: 17/381,081

(22) Filed: Jul. 20, 2021

(65) Prior Publication Data

US 2022/0115491 A1  Apr. 14, 2022

(30) Foreign Application Priority Data

Oct. 14, 2020 (KR) ........................ 10-2020-0132975

(51) Int. Cl.
*H10K 59/131* (2023.01)

(52) U.S. Cl.
CPC .................................. *H10K 59/131* (2023.02)

(58) Field of Classification Search
CPC ................ H10K 59/131; H10K 59/124; H01L 27/1244; H01L 27/124; H01L 27/1248; G09G 2330/08
See application file for complete search history.

(56) References Cited

U.S. PATENT DOCUMENTS

| 8,558,239 | B2 | 10/2013 | Lee et al. | |
|---|---|---|---|---|
| 9,679,957 | B2 | 6/2017 | Kwon et al. | |
| 10,032,805 | B2 | 7/2018 | Ye et al. | |
| 10,804,336 | B2 | 10/2020 | Kim et al. | |
| 2010/0000765 | A1* | 1/2010 | Hirakata | G02F 1/1309 |
| | | | | 174/250 |
| 2016/0104402 | A1 | 4/2016 | Kim | |
| 2018/0083072 | A1* | 3/2018 | Kwon | H10K 59/35 |
| 2019/0148413 | A1* | 5/2019 | Kim | G02F 1/133305 |
| 2019/0163304 | A1* | 5/2019 | Shim | H01L 27/124 |

(Continued)

FOREIGN PATENT DOCUMENTS

KR  10-2011-0051858 A  5/2011
KR  10-2016-0122892 A  10/2016

(Continued)

*Primary Examiner* — Fernando L Toledo
*Assistant Examiner* — Jahae Kim
(74) *Attorney, Agent, or Firm* — Lewis Roca Rothgerber Christie LLP

(57) ABSTRACT

A display apparatus includes: a substrate comprising a display area and a peripheral area outside the display area; a first insulating layer covering the peripheral area; a plurality of first pads on the first insulating layer in the peripheral area; a second insulating layer on the first insulating layer in the peripheral area, the second insulating layer having an opening exposing the plurality of first pads; and a first wiring comprising a 1-1st wiring and a 1-2nd wiring, wherein, in a plan view, the 1-1st wiring is under the first insulating layer to cross the opening of the second insulating layer in the peripheral area, the 1-2nd wiring is electrically connected to the 1-1st wiring outside the opening in the second insulating layer, and the 1-2nd wiring is between the first insulating layer and the second insulating layer.

21 Claims, 12 Drawing Sheets

(56) References Cited

U.S. PATENT DOCUMENTS

2020/0013330 A1    1/2020  Kim et al.
2020/0209177 A1*   7/2020  Kim .................... G09G 3/3233

FOREIGN PATENT DOCUMENTS

| KR | 10-2019-0001237 A | 1/2019 |
| KR | 10-2020-0004932 A | 1/2020 |
| KR | 10-2020-0012067 A | 2/2020 |

* cited by examiner

DISPLAY APPARATUS

CROSS-REFERENCE TO RELATED APPLICATION

The present application claims priority to and the benefit of Korean Patent Application No. 10-2020-0132975, filed on Oct. 14, 2020, in the Korean Intellectual Property Office, the entire disclosure of which is incorporated herein by reference.

BACKGROUND

1. Field

Aspects of one or more embodiments relate to a display apparatus.

2. Description of Related Art

In general, a display apparatus has a display area in which a lot of pixels are located. In addition, wirings for applying various electrical signals to the display area may be in the display area or a peripheral area of the display area. In a display apparatus, when defects occur in wirings, etc., it may not be accurately checked whether the display apparatus properly operates, and the quality of images implemented after being manufactured may degrade. However, in a display apparatus according to the related art, defects may occur in wirings during manufacturing processes.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus in which defects that may occur in wirings during manufacturing processes may be reduced.

One or more embodiments include a display apparatus, in which generation of defects in wirings during manufacturing processes may be reduced. However, the above technical features are merely examples, and the scope of embodiments according to the present disclosure is not limited thereto.

Additional aspects will be set forth in part in the description which follows and, in part, will be apparent from the description, or may be learned by practice of the presented embodiments of the disclosure.

According to some embodiments, a display apparatus includes a substrate including a display area and a peripheral area outside the display area, a first insulating layer covering the peripheral area, a plurality of first pads on the first insulating layer in the peripheral area of the substrate, a second insulating layer on the first insulating layer in the peripheral area of the substrate, the second insulating layer having an opening that exposes the plurality of first pads, and a first wiring including a 1-1st wiring and a 1-2nd wiring, wherein, when viewed from a direction perpendicular to an upper surface of the substrate (e.g., in a plan view), the 1-1st wiring is under the first insulating layer to cross the opening of the second insulating layer in the peripheral area of the substrate, the 1-2nd wiring is electrically connected to the 1-1st wiring outside of the opening in the second insulating layer, and the $1\text{-}2^{nd}$ wiring is between the first insulating layer and the second insulating layer.

According to some embodiments, the plurality of first pads and the 1-2nd wiring include a same material.

According to some embodiments, the plurality of first pads and the 1-2nd wiring have a same layered structure.

According to some embodiments, the display apparatus may further include a second wiring including a 2-1st wiring and a 2-2nd wiring, wherein, when viewed from the direction perpendicular to the upper surface of the substrate (e.g., in the plan view), the 2-1st wiring is under the first insulating layer to cross the opening of the second insulating layer in the peripheral area of the substrate, the 2-2nd wiring is electrically connected to the 2-1st wiring outside of the opening in the second insulating layer, and the 2-2nd wiring is between the first insulating layer and the second insulating layer.

According to some embodiments, the 1-1st wiring may include a portion parallel to at least a part of the 2-1st wiring.

According to some embodiments, the 1-1st wiring may extend to surround the display area.

According to some embodiments, the display apparatus may further include data lines crossing the display area, wherein the 2-2nd wiring is configured to apply a test signal to the data lines.

According to some embodiments, the display apparatus may further include a plurality of second wirings between the first insulating layer and the second insulating layer, wherein, when viewed from the direction perpendicular to the upper surface of the substrate(e.g., in the plan view), the plurality of second wirings cross the opening of the second insulating layer in the peripheral area of the substrate.

According to some embodiments, the 1-1st wiring may include a portion parallel to at least a part in each of the plurality of second wirings.

According to some embodiments, the 1-1st wiring may extend to surround the display area.

According to some embodiments, the display apparatus may include data lines crossing the display area, wherein the plurality of second wirings are configured to apply test signals to the data lines.

According to some embodiments, the display apparatus may further include a second wiring between the first insulating layer and the second insulating layer, wherein, when viewed from the direction perpendicular to the upper surface of the substrate (e.g., in the plan view), the second wiring crosses the opening of the second insulating layer in the peripheral area of the substrate, and a third wiring including a 3-1st wiring and a 3-2nd wiring, wherein, when viewed from the direction perpendicular to the upper surface of the substrate (e.g., in the plan view), the 3-1st wiring is under the first insulating layer to cross the opening of the second insulating layer in the peripheral area of the substrate, the 3-2nd wiring is electrically connected to the 3-1st wiring outside of the opening in the second insulating layer, and the 3-2nd wiring is between the first insulating layer and the second insulating layer.

According to some embodiments, the 1-1st wiring may include a portion parallel to at least a part in each of the second wiring and the 3-1st wiring.

According to some embodiments, the 1-1st wiring may extend to surround the display area.

According to some embodiments, the display apparatus may further include data lines crossing the display area, wherein the second wiring and the third wiring are configured to apply test signals to the data lines.

According to some embodiments, when viewed from the direction perpendicular to the upper surface of the substrate (e.g., in the plan view), the opening of the second insulating layer may have a loop shape.

According to some embodiments, when viewed from the direction perpendicular to the upper surface of the substrate (e.g., in the plan view), the 1-2nd wiring may be under an island shape portion of the second insulating layer, the island shape portion being defined by the opening of the second insulating layer.

According to some embodiments, the display apparatus may further include a plurality of second pads on the first insulating layer in the peripheral area of the substrate, and connecting lines connecting some of the plurality of first pads to the plurality of second pads and located under the first insulating layer.

According to some embodiments, the display apparatus may further include a plurality of second pads on the first insulating layer in the peripheral area of the substrate, a first connecting line connecting a 1-1st pad from among the plurality of first pads to a 2-1st pad from among a plurality of second pads, and located under the first insulating layer, and a second connecting line connecting a 1-2nd pad from among the plurality of first pads to a 2-2nd pad from among the plurality of second pads, and located between the first insulating layer and the second insulating layer.

According to some embodiments, the display apparatus may further include a third connecting line connecting a 1-3rd pad from among the plurality of first pads to a 2-3rd pad from among the plurality of second pads, and located under the first insulating layer, wherein, when viewed from the direction perpendicular to the upper surface of the substrate (e.g., in the plan view), the second connecting line may be between the first connecting line and the third connecting line.

According to some embodiments, the display apparatus may further include a fourth connecting line connecting a 1-4th pad from among the plurality of first pads to a 2-4th pad from among the plurality of second pads, and located between the first insulating layer and the second insulating layer, wherein, when viewed from the direction perpendicular to the upper surface of the substrate (e.g., in the plan view), the third connecting line may be between the second connecting line and the fourth connecting line.

Other aspects, features and characteristics of some embodiments of the present disclosure will become better understood through the accompanying drawings, the claims and the detailed description.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
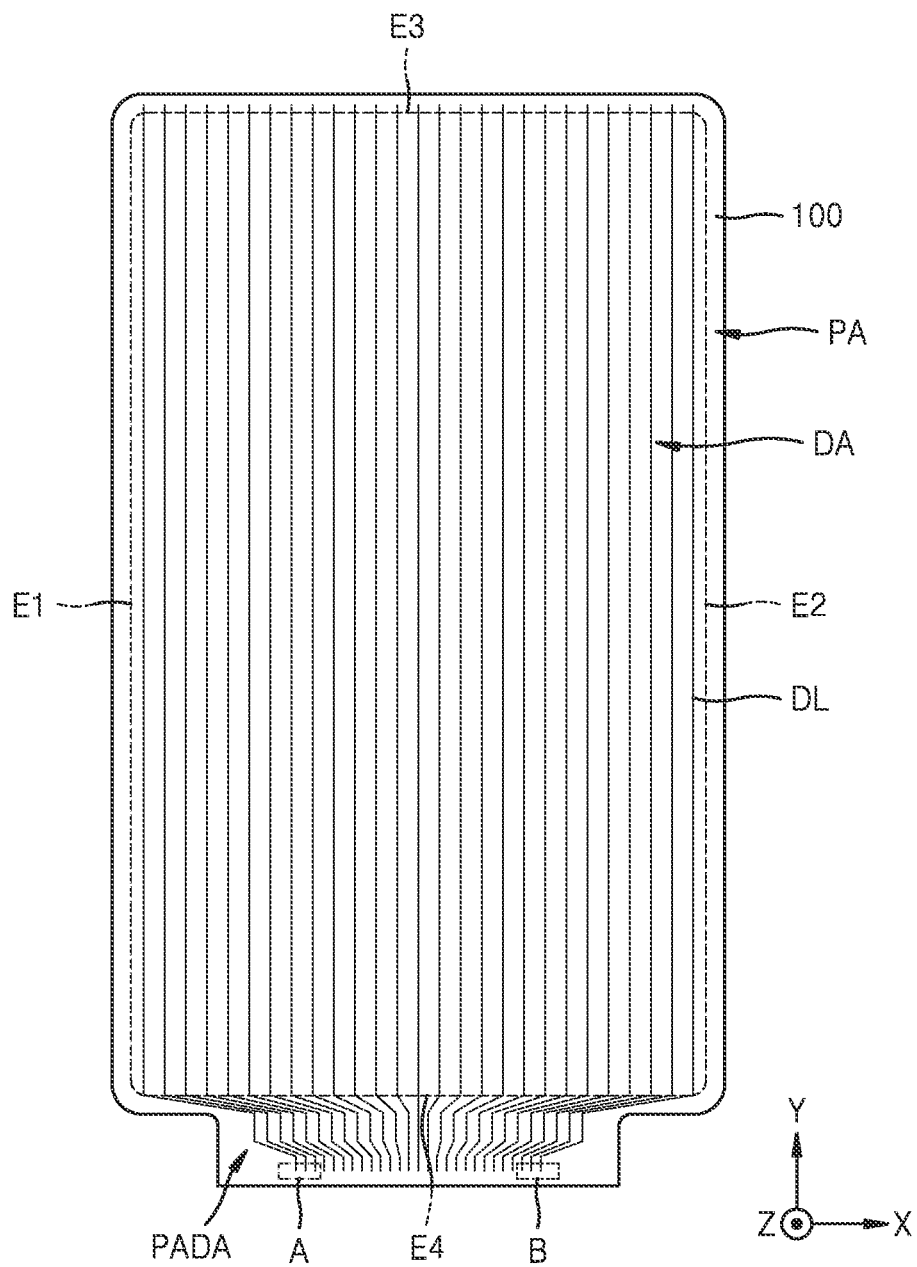
FIG. 1 is a conceptual diagram showing an aspect of a display apparatus during manufacturing process, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, aspects of some embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, aspects of some embodiments will be illustrated in the drawings and described in more detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

Aspects of some embodiments will be described below in more detail with reference to the accompanying drawings. Those components that are the same or are in correspondence are rendered the same reference numeral regardless of the figure number, and redundant explanations are omitted.

It will be understood that when an element such as a layer, film, region or substrate is referred to as being placed "on" another element, it can be directly placed on the other element, or an intervening layer(s) may also be present. Sizes of components in the drawings may be exaggerated for convenience of explanation. In other words, because sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
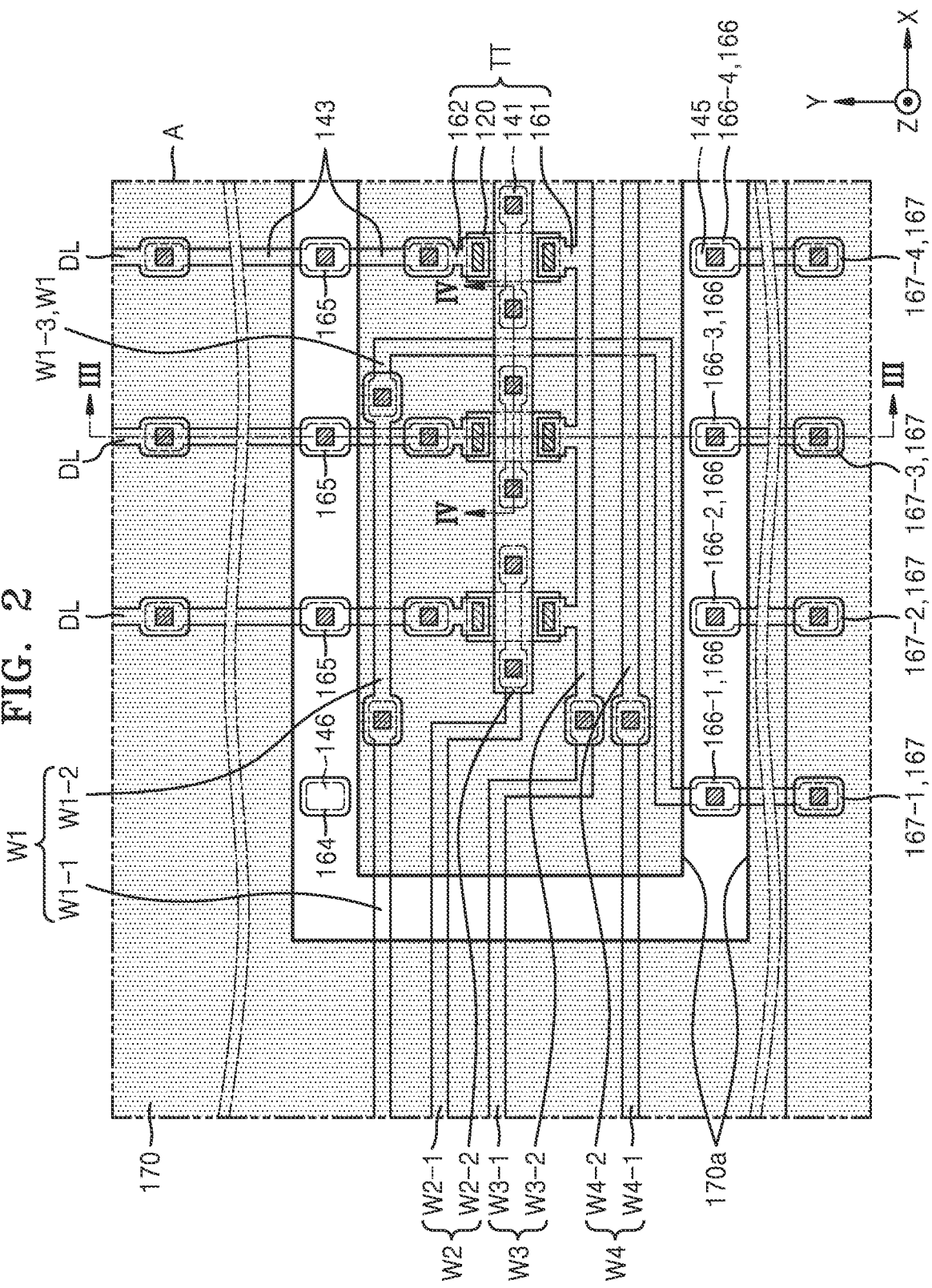
FIG. 2 is a conceptual diagram of region A in FIG. 1 according to some embodiments.
Figure 3:
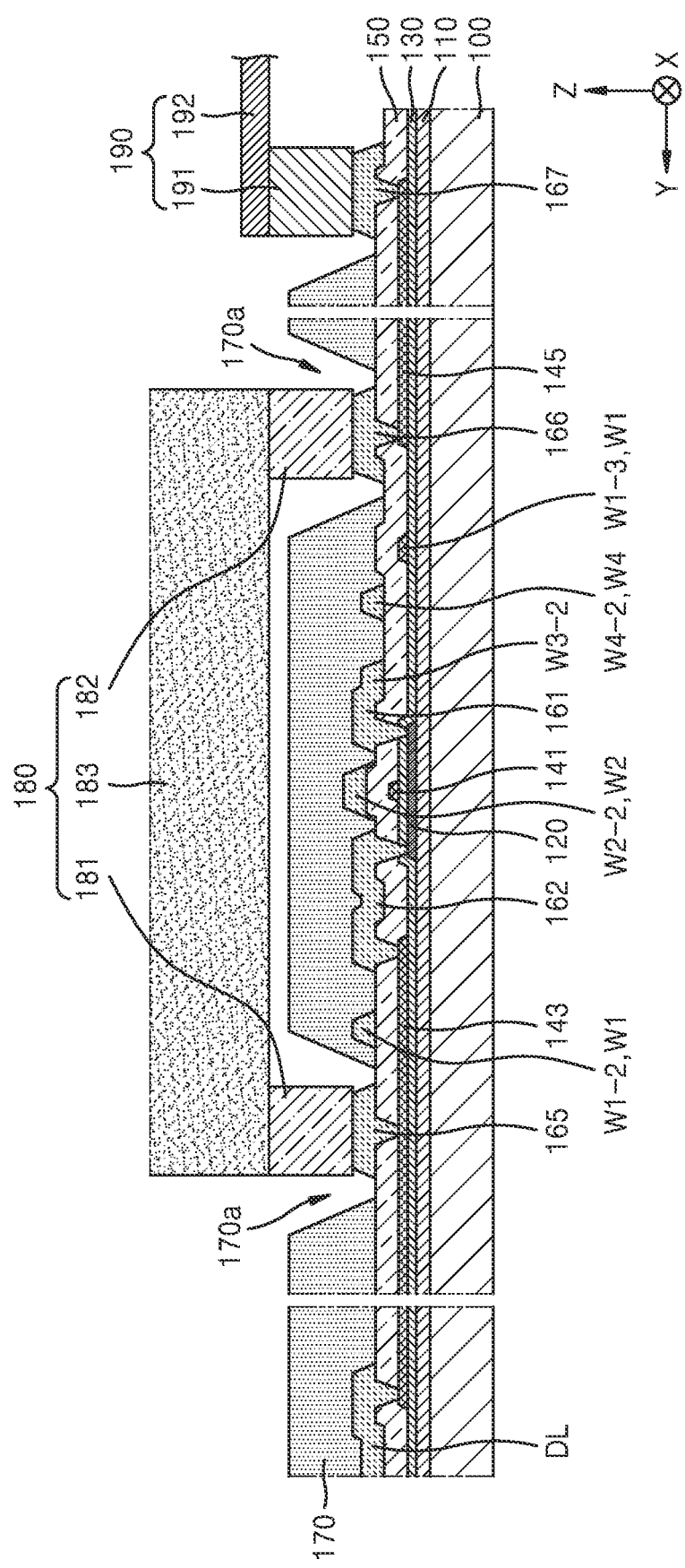
FIG. 3 is a cross-sectional view of the display apparatus taken along the line III-III of FIG. 2.
Figure 4:
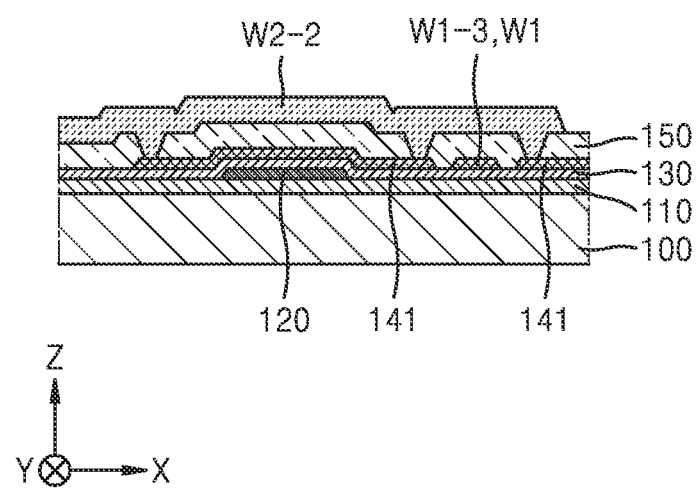
FIG. 4 is a cross-sectional view of the display apparatus taken along the line IV-IV of FIG. 2.

FIG. 1 is a conceptual diagram showing an aspect of a display apparatus during manufacturing processes, according to some embodiments, FIG. 2 is a conceptual diagram showing region A of FIG. 1, FIG. 3 is a cross-sectional view of the display apparatus taken along line III-III of FIG. 2, and FIG. 4 is a cross-sectional view of the display apparatus taken along line IV-IV of FIG. 2.

The display apparatus according to some embodiments includes a display area DA including a plurality of pixels, and a peripheral area PA on an outer portion of the display area DA, as shown in FIG. 1. This may be understood that a substrate 100 included in the display apparatus includes the display area DA and the peripheral area PA. The peripheral area PA includes a pad area PADA to which various electronic devices, a printed circuit board, etc. are electrically attached.

FIG. 1 may be understood as a plan view showing the substrate, etc. during manufacturing processes. In a final product of the display apparatus or an electronic device such as a smartphone including the display apparatus, the substrate may be partially bent in order to reduce an area of the peripheral area PA recognized by a user. For example, the peripheral area PA includes a bending area which may be between the pad area PADA and the display area DA. In this case, the substrate may be bent at the bending area, such that the pad area PADA may at least partially overlap the display area DA. The bending direction is set so that the pad area PADA is behind the display area DA, that is, so that the pad area PADA may not cover the display area DA. Accordingly, the user may recognize that the display area DA occupies most of the display apparatus.

The substrate 100 may include various flexible or bendable materials, for example, may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified, for example, the substrate 100 may have a multi-layered structure including two layers each having a polymer resin and a barrier layer including an inorganic material such as silicon oxide, silicon nitride, silicon oxynitride, etc. between the two layers. Moreover, when the substrate 100 is not bent, the substrate 100 may include glass, etc.

Edges of the display area DA may entirely have a rectangular or square shape (or a shape similar to a rectangle or a square). However, as shown in FIG. 1, the edges of the display area DA may not have sharp portions. For example, the display area DA may include a first edge E1 and a second edge E2 facing each other, and a third edge E3 and a fourth edge E4 facing each other between the first edge E1 and the second edge E2. The pad area PADA is adjacent to the fourth edge E4 from among the first edge E1 to the fourth edge E4. Here, a connecting portion (e.g., a corner) between the first edge E1 and the fourth edge E4 may have a round shape. In the display area DA, a connecting portion (e.g., a corner) between the second edge E2 and the fourth edge E4 may also have a round shape, and the remaining connecting portion or portions (e.g., corners) may have a round shape.

As shown in FIG. 2, the display apparatus according to some embodiments includes a plurality of thin film transistors TT in the peripheral area PA, for example, in the pad area PADA. The plurality of thin film transistors TT are thin film transistors for testing, which are provided for checking whether the pixels in the display area DA normally operate during the manufacturing process.

Each of the plurality of thin film transistors TT includes a semiconductor layer 120 including amorphous silicon, polycrystalline silicon, an oxide semiconductor material, or an organic semiconductor material, a gate electrode 141, a source electrode 161, and a drain electrode 162, as shown in FIGS. 2 to 4. In order to ensure an insulating property between the semiconductor layer 120 and the gate electrode 141, a gate insulating layer 130 including an inorganic material such as silicon oxide, silicon nitride, and/or silicon oxynitride may be between the semiconductor layer 120 and the gate electrode 141. In addition, an interlayer insulating layer 150 including an inorganic material such as silicon oxide, silicon nitride, and/or silicon oxynitride may be on the gate electrode 141, and the source electrode 161 and the drain electrode 162 may be on the interlayer insulating layer 150. The insulating layer including the inorganic material may be obtained through a chemical vapor deposition (CVD) or an atomic layer deposition (ALD) method. This will be also applied to embodiments and modifications thereof that will be described later.

In FIG. 2, the gate insulating layer 130 and the interlayer insulating layer 150 are omitted, and locational relations among the semiconductor layer 120, the gate electrode 141, the source electrode 161, and the drain electrode 162 are only shown. FIG. 2 also shows other various wirings and pads.

A buffer layer 110 including an inorganic material such as silicon oxide, silicon nitride, and/or silicon oxynitride may be between the thin film transistor TT and the substrate 100. The buffer layer 110 may increase flatness on an upper surface of the substrate 100 or may prevent or reduce infiltration of impurities from the substrate 100 into the semiconductor layer 120 of the thin film transistor TT.

The gate electrodes 141 in the plurality of thin-film transistors TT are electrically connected to one another via a 2-2nd wiring W2-2 that is a bridge wiring. That is, the 2-2nd wiring W2-2 that is at a different layer from that of the gate electrodes 141 electrically connects the gate electrodes 141, which are separate from one another, to one another. In FIG. 4, the 2-2nd wiring W2-2 is in direct contact with the gate electrodes 141 via contact holes formed in the interlayer insulating layer 150 between the 2-2nd wiring W2-2 and the gate electrodes 141, to electrically connect the gate electrodes 141 to one another. This will be also applied to embodiments and modifications thereof that will be described in more detail later. Accordingly, at least a part of the 2-2nd wiring W2-2 and the gate electrodes 141 may be on a virtual straight line (extending in an x-axis direction) as shown in FIG. 2.

Each of the thin film transistors TT includes the source electrode 161 and the drain electrode 162, and thus, the 2-2nd wiring W2-2 may include the same material as that of the source electrode 161 and the drain electrode 162, e.g., metal such as titanium, copper, or aluminum, and may have a single-layered or multi-layered structure. When the 2-2nd wiring W2-2 has a multi-layered structure, the 2-2nd wiring W2-2 may have a triple-layered structure including titanium/aluminum/titanium. Moreover, the 2-2nd wiring W2-2 may be at the same layer as those of the source electrode 161 and the drain electrode 162, that is, on the interlayer insulating layer 150. The interlayer insulating layer 150 may be referred to as a first insulating layer. Accordingly, the 2-2nd wiring W2-2 may be connected to the gate electrodes 141 thereunder via the contact holes in the interlayer insulating layer 150.

As shown in FIG. 1, a plurality of data lines DL extend to the peripheral area PA across the display area DA. Each of the plurality of thin film transistors TT is electrically connected to a corresponding data line DL from among the plurality of data lines DL. Accordingly, when electrical signals are applied to the gate electrodes 141 electrically connected to one another in the plurality of thin-film transistors TT, channels are simultaneously formed in the semiconductor layers 120 of the plurality of thin-film transistors TT. As described above, when the plurality of thin-film transistors TT are simultaneously turned on, an electrical signal from a third wiring W3, that is, a test signal line, is transferred to the plurality of data lines DL. Accordingly, pixels in the display area DA, which are electrically connected to the plurality of data lines DL, emit light, and it may be inspected whether there is a defect in the pixels of the display area DA.

After finishing the manufacturing of the display apparatus, the thin-film transistors TT for testing are turned off when using the display apparatus. For example, when the thin-film transistors TT for testing are P-type thin film transistors, a VGH bias voltage (positive bias voltage) is applied to the second wiring W2 to turn the test thin film transistors TT off. Accordingly, a signal from a driving chip 180 that will be described later may be applied to the data line DL via first pads 165.

The gate electrodes 141 may include, for example, a metal such as molybdenum, aluminum, etc., and may have a single-layered or multi-layered structure. When having the multi-layered structure, the gate electrodes 141 may have a triple-layered structure including molybdenum/aluminum/molybdenum. The gate electrodes 141 may be between the gate insulating layer 130 and the interlayer insulating layer 150 as described above. Therefore, the gate electrodes 141 are under the interlayer insulating layer 150, that is, the first insulating layer.

As described above, the plurality of data lines DL extend to the peripheral area PA across the display area DA. The plurality of data lines DL may include the same material as that in the source electrode 161 and the drain electrode 162 of the thin-film transistor TT, for example, metal such as titanium, copper, aluminum, etc., and may have a single-layered or multi-layered structure. When having a multi-layered structure, the plurality of data lines DL may each have a triple-layered structure including titanium/aluminum/titanium. Moreover, the plurality of data lines DL may be at the same layer as that of the source electrode 161 and the drain electrode 162. Each of the plurality of thin-film transistors TT is electrically connected to a corresponding data line DL from among the plurality of data lines DL, and the connection may be performed by intermediate lines 143. That is, the intermediate lines 143 connect the plurality of data lines DL to the plurality of thin-film transistors TT.

The intermediate lines 143 may include the same material as that of the gate electrodes 141, e.g., a metal such as molybdenum, aluminum, etc., and may have a single-layered or multi-layered structure. When having the multi-layered structure, the intermediate lines 143 may have a triple-layered structure including molybdenum/aluminum/molybdenum. In addition, the intermediate lines 143 may be at the same layer as that of the gate electrodes 141. An end of each intermediate line 143 in the data line DL direction is connected to the data line DL thereon via the contact hole in the interlayer insulating layer 150, and an end of the intermediate line 143 in the thin-film transistor TT direction is connected to the drain electrode 162 thereon via the contact hole in the interlayer insulating layer 150. In addition, the source electrodes 161 of the thin-film transistors TT are connected to a 3-2nd wiring W3-2 that is a part of the third wiring W3 (having a portion extending in the x-axis direction) that is a test signal line, and for example, the source electrodes 161 may be integrally provided with the 3-2nd wiring W3-2.

As shown in FIGS. 2 and 3, the display apparatus may include a plurality of first pads 164, 165, and 166. From among the plurality of first pads 164, 165, and 166, each of the first pads 165 that are in a direction toward the display area DA (+y direction) based on the plurality of thin-film transistors TT for testing is above a corresponding intermediate line 143 from among the intermediate lines 143, and may be in contact with the corresponding intermediate line 143. Each of the plurality of first pads 164, 165, and 166 may include the same material as that in the source electrode 161 and the drain electrode 162 of the thin-film transistor TT, for example, metal such as titanium, copper, aluminum, etc., and may have a single-layered or multi-layered structure. When having a multi-layered structure, each of the plurality of first pads 164, 165, and 166 may have a triple-layered structure including titanium/aluminum/titanium. Moreover, the plurality of first pads 164, 165, and 166 may be at the same layer as that of the source electrode 161 and the drain electrode 162. Accordingly, the plurality of first pads 164, 165, and 166 may be connected to the intermediate lines 143 thereunder via the contact holes in the interlayer insulating layer 150.

Some (e.g., the first pad 164) of the plurality of first pads 164, 165, and 166 may be a dummy pad that is not connected to other electric elements on the substrate 100. Here, a height from a bottom surface of the substrate 100 to upper surfaces of the first pads 165 that are electrically connected to the data lines DL needs to be similar to a height from the bottom surface of the substrate 100 to an upper surface of the first pad 164 that is the dummy pad. To this end, because the intermediate lines 143 are under the first pads 165 that are electrically connected to the data lines DL, a step adjusting portion 146 may be under the first pad 164 that is the dummy pad in the direction toward the substrate 100. The step adjusting portion 146 may include the same material as that of the intermediate lines 143, that is, the same material as the gate electrodes 141, e.g., the metal such as molybdenum, aluminum, etc., and may have the same layered structure as that of the intermediate lines 143.

The first pads 165 from among the plurality of first pads 164, 165, and 166 are in the direction toward the display area DA (+y direction) based on the plurality of thin-film transistors TT, and the first pads 166 from among the plurality of first pads 164, 165, and 166 are in the opposite direction to the display area DA (−y direction) based on the plurality of thin film transistors TT. The first pads 165 and 166 may be connected to the driving chip 180 included in the display apparatus via an anisotropic film as shown in FIG. 3.

Figure 5:
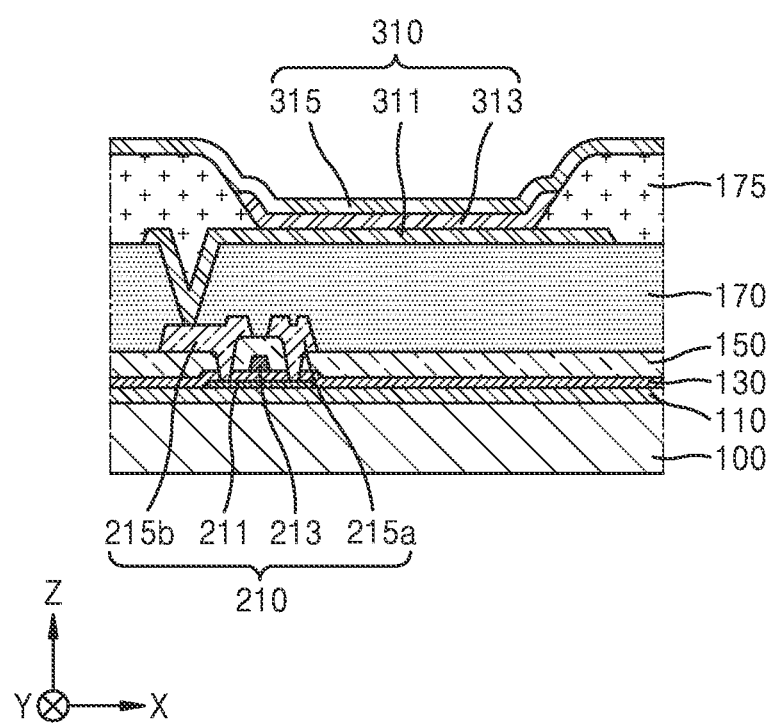
FIG. 5 is a cross-sectional view of a portion in the display area of FIG. 1 according to some embodiments.

The plurality of first pads 164, 165, and 166 are on the interlayer insulating layer 150 that is the first insulating layer covering the peripheral area PA, as described above. In addition, a planarization layer 170, that is, a second insulating layer, is on the interlayer insulating layer 150 in the peripheral area PA. The interlayer insulating layer 150 and the planarization layer 170 may be also in the display area DA as shown in FIG. 5. The planarization layer 170 may include, for example, an organic material such as acryl, benzocyclobutene (BCB), hexamethyldisiloxane (HMDSO), etc. The planarization layer 170 includes openings 170a exposing the plurality of first pads 164, 165, and 166.

The driving chip 180 includes a body 183 and output terminals 181 and input terminals 182 at opposite sides of the body 183. The cross-sectional view of FIG. 3 only shows one output terminal 181 and one input terminal 182 of the driving chip 180, but the driving chip 180 may include a plurality of output terminals 181 and a plurality of input terminals 182 (arranged in the x-axis direction). The driving chip 180 may be, for example, an IC chip, etc.

The first pads 166 exposed by the openings 170a in the planarization layer 170 are connected to the input terminals 182 of the driving chip 180, and the first pads 165 are connected to the output terminals 181 of the driving chip 180. Accordingly, when the display apparatus is actually driven, not tested, the electrical signals from the driving chip 180 are transferred to the data lines DL from the output terminals 181 of the driving chip 180 via the first pads 165 and the intermediate lines 143, and consequently, may be transferred to the plurality of pixels in the display area DA.

Information about an image to be implemented through the display area DA may be input to the driving chip 180 via the input terminals 182 of the driving chip 180. To this end, the display apparatus may include a printed circuit board 190 including a plate 192 and output terminals 191. The cross-sectional view of FIG. 3 only shows one output terminal 191 of the printed circuit board 190, but the printed circuit board 190 may include a plurality of output terminals 191 (arranged in the x-axis direction).

The display apparatus includes second pads 167 located in an opposite direction to the display area DA (−y direction) based on the first pads 166. Each of the second pads 167 may include the same material as that in the source electrode 161 and the drain electrode 162 of the thin-film transistor TT, for example, a metal such as titanium, copper, aluminum, etc., and may have a single-layered or multi-layered structure. When having the multi-layered structure, the second pads 167 may each have a triple-layered structure including titanium/aluminum/titanium. Moreover, the second pads 167 may be at the same layer as that of the source electrode 161 and the drain electrode 162. That is, the second pads 167 may be on the interlayer insulating layer 150 that is the first insulating layer.

The second pads 167 may be electrically connected to the corresponding first pads 166 via connecting lines 145. The connecting lines 145 may include the same material as that of the gate electrodes 141, for example, a metal or conductive material such as molybdenum, aluminum, etc., and may have a single-layered or multi-layered structure. When having the multi-layered structure, each of the connecting lines 145 may have a triple-layered structure including molybdenum/aluminum/molybdenum. In addition, the connecting lines 145 may be at the same layer as that of the gate electrodes 141. That is, the connecting lines 145 may be between the gate insulating layer 130 and the interlayer insulating layer 150, that is, the first insulating layer. An end of each connecting line 145 in the direction toward the display area DA is connected to the first pad 166 thereon via the contact hole in the interlayer insulating layer 150, and an opposite end of the connecting line 145 is connected to the second pad 167 thereon via the contact hole in the interlayer insulating layer 150.

As described above, information about an image to be implemented through the display area DA may be input to the driving chip 180 via the input terminals 182 of the driving chip 180. To this end, the output terminals 191 of the printed circuit board 190 may be electrically connected to the second pads 167 via an anisotropic conductive film, etc., the second pads 167 may be electrically connected to the first pads 166 via the connecting lines 145, and the first pads 166 may be electrically connected to the input terminals 182 of the driving chip 180.

In addition, the input terminals 182 of the driving chip 180 are connected to the first pads 166 via the anisotropic conductive film, etc., and the output terminals 181 of the driving chip 180 are connected to the first pads 165 via the anisotropic conductive film, etc. Accordingly, as shown in FIG. 3, the driving chip 180 is on the thin-film transistors TT for testing. During the process, the first pad 164 that is the dummy pad not connected to other electric elements on the substrate 100 is also connected to the input terminal 182 of the driving chip 180 via the anisotropic conductive film, etc.

As described above, the step adjusting portion 146 is below the first pad 164 in a direction toward the substrate 100, wherein the first pad 164 is a dummy pad, and thus, a height from the bottom surface of the substrate 100 to the upper surfaces of the first pads 165 that are connected to the data lines DL and a height from the bottom surface of the substrate 100 to the upper surface of the first pad 164 that is the dummy pad are similar to or the same as each other. Therefore, the driving chip 180 may be stably positioned.

As shown in FIG. 2, the display apparatus according to some embodiments includes the first wiring W1. The first wiring W1 includes a 1-1st wiring W1-1st and a 1-2nd wiring W1-2. The 1-1st wiring W1-1st is located in the peripheral area PA of the substrate 100 across the opening 170a of the planarization layer 170 that is the second insulating layer, when viewed from a direction perpendicular or normal with respect to the upper surface (or display surface or primary display surface or plane) of the substrate 100 (z-axis direction) (e.g., when viewed in a plan view). However, because the 1-1st wiring W1-1st is under the interlayer insulating layer 150 that is the first insulating layer, the 1-1st wiring W1-1st is not exposed to outside through the opening 170a of the planarization layer 170, that is, the second insulating layer. The 1-2nd wiring W1-2 is electrically connected to the 1-1st wiring W1-1st outside the opening 170a of the planarization layer 170, and is between the interlayer insulating layer 150, that is, the first insulating layer, and the planarization layer 170, that is, the second insulating layer. Therefore, the first wiring W1 is covered by the interlayer insulating layer 150, that is, the first insulating layer, or by the planarization layer 170, that is, the second insulating layer. Therefore, after forming the planarization layer 170 during the manufacturing processes, the first wiring W1 is not exposed to outside, and thus, defects caused by the first wiring W1 may be effectively prevented or reduced.

As described above, the 1-1st wiring W1-1st is under the interlayer insulating layer 150, and for example, may be on the gate insulating layer 130. Therefore, the 1-1st wiring W1-1st may include the same material as that of the gate electrodes 141, e.g., the metal such as molybdenum, aluminum, etc., and may have the same layered structure as that of the gate electrodes 141. That is, the 1-1st wiring W1-1st may have a single-layered or multi-layered structure. When having the multi-layered structure, the 1-1st wiring W1-1st may have a triple-layered structure including molybdenum/aluminum/molybdenum. In addition, the 1-1st wiring W1-1st may be at the same layer as that of the gate electrodes 141.

The 1-2nd wiring W1-2 is between the interlayer insulating layer 150 and the planarization layer 170, and for example, may be on the interlayer insulating layer 150. Accordingly, the 1-2nd wiring W1-2 may be connected to the 1-1st wiring W1-1st thereunder via the contact hole in the interlayer insulating layer 150. The 1-2nd wiring W1-2 may include the same material as that of the first pads 164, 165, and 166, the source electrode 161, and the drain electrode 162, for example, a metal such as titanium, copper, aluminum, etc., and may have the same layered structure as that of the first pads 164, 165, and 166, the source electrode 161, and the drain electrode 162. That is, the 1-2nd wiring W1-2 may have a single-layered or multi-layered structure. When the 1-2nd wiring W1-2 has a multi-layered structure, the 1-2nd wiring W1-2 may have a triple-layered structure including titanium/aluminum/titanium.

The first wiring W1 may also include a 1-3rd wiring W1-3, in addition to the 1-1st wiring W1-1st and the 1-2nd wiring W1-2. An end of the 1-2nd wiring W1-2 is connected to the 1-1st wiring W1-1st and an opposite end of the 1-2nd wiring W1-2 is connected to the 1-3rd wiring W1-3. The 1-3rd wiring W1-3 is under the interlayer insulating layer 150, and for example, may be on the gate insulating layer 130. That is, the 1-3rd wiring W1-3 may be at the same layer as that of the 1-1st wiring W1-1st. Therefore, the 1-3rd wiring W1-3 may include the same material as that of the 1-1st wiring W1-1st, e.g., the metal such as molybdenum, aluminum, etc., and may have the same layered structure as that of the 1-1st wiring W1-1st. In addition, the 1-3rd wiring W1-3 may be connected to the opposite end of the 1-2nd wiring W1-2 thereon via the contact hole in the interlayer insulating layer 150.

The 1-3rd wiring W1-3 may be connected to a first pad 166-1 that is one of the first pads 166. That is, the 1-3rd wiring W1-3 extends to the lower portion of the first pad 166-1 and may be connected to the first pad 166-1 thereon via the contact hole in the interlayer insulating layer 150. Also, the first pad 166-1 may be connected to a second pad 167-1 that is one of the second pads 167 via the connecting line 145.

As a reference, FIG. 2 shows that a first pad 166-2, a first pad 166-3, and a first pad 166-4 from among the first pads 166 are not connected to other wirings in the direction toward the display area DA (+y direction). However, FIG. 2 shows the above arrangement for convenience of description, and the first pad 166-2, 166-3, or 166-4 may be also connected to the other wirings. The other wirings may be between the gate insulating layer 130 and the interlayer insulating layer 150 or may be on the interlayer insulating layer 150. This will be also applied to embodiments and modifications thereof that will be described in more detail later.

As shown in FIG. 2, the display apparatus according to some embodiments may include a second wiring W2. The second wiring W2 may include a 2-1st wiring W2-1 and the 2-2nd wiring W2-2. The 2-1st wiring W2-1 is located in the peripheral area PA of the substrate 100 across the opening 170a of the planarization layer 170 that is the second insulating layer, when viewed from the direction perpendicular or normal to the upper surface of the substrate 100 (z-axis direction) (e.g., when viewed in a plan view). However, because the 2-1st wiring W2-1 is under the interlayer insulating layer 150 that is the first insulating layer, the 1-1st wiring W1-1st is not exposed to outside through the opening 170a of the planarization layer 170, that is, the second insulating layer. The 2-2nd wiring W2-2 is electrically connected to the 2-1st wiring W2-1 outside the opening 170a of the planarization layer 170, and is between the interlayer insulating layer 150, that is, the first insulating layer, and the planarization layer 170, that is, the second insulating layer. Therefore, the second wiring W2 is covered by the interlayer insulating layer 150, that is, the first insulating layer, or by the planarization layer 170, that is, the second insulating layer. Therefore, after forming the planarization layer 170 during the manufacturing processes, the second wiring W2 is not exposed to outside, and thus, defects caused by the second wiring W2 may be effectively prevented or reduced.

As described above, the 2-1st wiring W2-1 is under the interlayer insulating layer 150, and for example, may be on the gate insulating layer 130. Therefore, the 2-1st wiring W2-1 may include the same material as that of the 1-1st wiring W1-1st, e.g., a metal such as molybdenum, aluminum, etc., and may have the same layered structure as that of the 1-1st wiring W1-1st. That is, the 2-1st wiring W2-1 may have a single-layered or multi-layered structure. When having the multi-layered structure, the 2-1st wiring W2-1 may have a triple-layered structure including molybdenum/ aluminum/molybdenum. Moreover, the 2-1st wiring W2-1 may be at the same layer as that of the 1-1st wiring W1-1st. Also, as shown in FIG. 2, the 1-1st wiring W1-1st may include a portion that is in parallel with and adjacent to at least a part of the 2-1st wiring W2-1.

The 2-2nd wiring W2-2 is a bridge wiring as described above and electrically connects the gate electrodes 141 to each other. In FIG. 4, the 2-2nd wiring W2-2 is in direct contact with the gate electrodes 141 via contact holes formed in the interlayer insulating layer 150 between the 2-2nd wiring W2-2 and the gate electrodes 141, to electrically connect the gate electrodes 141 to one another. Also, the 2-2nd wiring W2-2 may be connected to the 2-1st wiring W2-1 thereunder via the contact hole formed in the interlayer insulating layer 150.

In addition, as described above, the display apparatus according to some embodiments may include the third wiring W3 that is a test signal line. The third wiring W3 includes a 3-1st wiring W3-1 and the 3-2nd wiring W3-2. The 3-1st wiring W3-1 is located in the peripheral area PA of the substrate 100 across the opening 170a of the planarization layer 170 that is the second insulating layer, when viewed from the direction perpendicular or normal to the upper surface of the substrate 100 (z-axis direction) (e.g., when viewed in a plan view). However, because the 3-1st wiring W3-1 is under the interlayer insulating layer 150 that is the first insulating layer, the 3-1st wiring W3-1 is not exposed to outside through the opening 170a of the planarization layer 170, that is, the second insulating layer.

The 3-2nd wiring W3-2 is electrically connected to the 3-1st wiring W3-1 outside the opening 170a of the planarization layer 170, and is between the interlayer insulating layer 150, that is, the first insulating layer, and the planarization layer 170, that is, the second insulating layer. Therefore, the third wiring W3 is covered by the interlayer insulating layer 150, that is, the first insulating layer, or by the planarization layer 170, that is, the second insulating layer. Therefore, after forming the planarization layer 170 during the manufacturing processes, the third wiring W3 is not exposed to outside, and thus, defects caused by the third wiring W3 may be effectively prevented or reduced.

As described above, the 3-1st wiring W3-1 is under the interlayer insulating layer 150, and for example, may be on the gate insulating layer 130. Therefore, the 3-1st wiring W3-1 may include the same material as that of the 2-1st wiring W2-1, e.g., a metal such as molybdenum, aluminum, etc., and may have the same layered structure as that of the 2-1st wiring W2-1. That is, the 3-1st wiring W3-1 may have a single-layered or multi-layered structure. When having the multi-layered structure, the 3-1st wiring W3-1 may have a triple-layered structure including molybdenum/aluminum/ molybdenum. Moreover, the 3-1st wiring W3-1 may be at the same layer as that of the 2-1st wiring W2-1. Also, as shown in FIG. 2, the 3-1st wiring W3-1 may include a portion that is in parallel with and adjacent to at least a part of the 2-1st wiring W2-1.

The 3-2nd wiring W3-2 that is a part of the third wiring W3, e.g., the test signal line (having a portion extending in the x-axis direction), is connected to the source electrodes 161 of the thin film transistors TT, and for example, the 3-2nd wiring W3-2 may be integrally provided with the source electrodes 161. That is, the 3-2nd wiring W3-2 is between the interlayer insulating layer 150 and the planarization layer 170, and for example, may be on the interlayer insulating layer 150. Accordingly, the 3-2nd wiring W3-2 may be connected to the 3-1st wiring W3-1 thereunder via the contact hole in the interlayer insulating layer 150. The 3-2nd wiring W3-2 may include the same material as that of the first pads 164, 165, and 166, the source electrode 161, and the drain electrode 162, for example, a metal such as titanium, copper, aluminum, etc., and may have the same layered structure as that of the first pads 164, 165, and 166, the source electrode 161, and the drain electrode 162. That is, the 3-2nd wiring W3-2 may have a single-layered or multi-layered structure. When the 3-2nd wiring W3-2 has a multi-layered structure, the 3-2nd wiring W3-2 may have a triple-layered structure including titanium/aluminum/titanium.

As described above, the plurality of thin-film transistors TT are thin-film transistors for testing, which are provided for checking whether the pixels in the display area DA normally operate during the manufacturing process. The second wiring W2 and the third wiring W3 are electrically connected to the plurality of thin-film transistors TT and are configured to apply test signals to the data lines DL. That is, a test gate signal is applied to the plurality of thin-film transistors TT via the second wiring W2 and a test data signal may be transferred to the plurality of data lines DL via the third wiring W3.

In addition, as shown in FIG. 2, the display apparatus according to some embodiments may include a fourth wiring W4. The fourth wiring W4 may include a 4-1st wiring W4-1 and a 4-2nd wiring W4-2. The 4-1st wiring W4-1 is located in the peripheral area PA of the substrate 100 across the opening 170a of the planarization layer 170 that is the second insulating layer, when viewed from the direction perpendicular or normal to the upper surface of the substrate 100 (z-axis direction) (e.g., when viewed in a plan view). However, because the 4-1st wiring W4-1 is under the interlayer insulating layer 150 that is the first insulating layer, the 4-1st wiring W4-1 is not exposed to outside through the opening 170a of the planarization layer 170, that is, the second insulating layer. The 4-2nd wiring W4-2 is electrically connected to the 4-1st wiring W4-1 outside the opening 170a of the planarization layer 170, and is between the interlayer insulating layer 150, that is, the first insulating layer, and the planarization layer 170, that is, the second insulating layer. Therefore, the fourth wiring W4 is covered by the interlayer insulating layer 150, that is, the first insulating layer, or by the planarization layer 170, that is, the second insulating layer. Therefore, after forming the planarization layer 170 during the manufacturing processes, the fourth wiring W4 is not exposed to outside, and thus, defects caused by the fourth wiring W4 may be effectively prevented or reduced.

As described above, the 4-1st wiring W4-1 is under the interlayer insulating layer 150, and for example, may be on the gate insulating layer 130. Therefore, the 4-1st wiring W4-1 may include the same material as that of the 1-1st wiring W1-1st, e.g., the metal such as molybdenum, aluminum, etc., and may have the same layered structure as that of the 1-1st wiring W1-1st. That is, the 4-1st wiring W4-1 may have a single-layered or multi-layered structure. When having the multi-layered structure, the 4-1st wiring W4-1 may have a triple-layered structure including molybdenum/aluminum/molybdenum. Moreover, the 4-1st wiring W4-1 may be at the same layer as that of the 1-1st wiring W1-1st.

Also, as shown in FIG. 2, the 4-1st wiring W4-1 may include a portion that is in parallel with and adjacent to at least a part of the 3-1st wiring W3-1.

The 4-2nd wiring W4-2 is between the interlayer insulating layer 150 and the planarization layer 170, and for example, may be on the interlayer insulating layer 150. Accordingly, the 4-2nd wiring W4-2 may be connected to the 4-1st wiring W4-1 thereunder via the contact hole in the interlayer insulating layer 150. The 4-2nd wiring W4-2 may include the same material as that of the 1-2nd wiring W1-2, e.g., a metal such as titanium, copper, aluminum, etc., and may have the same layered structure as that of the 1-2nd wiring W1-2. That is, the 4-2nd wiring W4-2 may have a single-layered or multi-layered structure. When the 4-2nd wiring W4-2 has a multi-layered structure, the 4-2nd wiring W4-2 may have a triple-layered structure including titanium/aluminum/titanium.

Similarly to the third wiring W3, the fourth wiring W4 may be electrically connected to the source electrodes 161 of the thin-film transistors TT for testing, to which the third wiring W3 is not connected, in a portion that is not shown in FIG. 2, and may be configured to apply test signals to the data lines DL that are electrically connected to the thin film transistors TT.

FIG. 5 is a cross-sectional view of a portion in the display area DA of FIG. 1. As shown in FIG. 5, a display device 310 and a thin film transistor 210 to which the display device 310 is electrically connected may be in the display area DA of the substrate 100. In FIG. 5, an organic light-emitting device is in the display area DA as the display device 310. That the organic light-emitting device is electrically connected to the thin film transistor 210 may be understood that a pixel electrode 311 thereof is electrically connected to the thin film transistor 210.

A semiconductor layer 211, a gate electrode 213, a source electrode 215a, and a drain electrode 215b of the thin film transistor 210 in the display area DA may include the same materials and may be at the same layer as that of corresponding one from among the semiconductor layer 120, the gate electrode 141, the source electrode 161, and the drain electrode 162 of the thin-film transistor TT in the peripheral area PA as described above. In addition, the planarization layer 170 may be on the thin film transistor 210. For example, as shown in FIG. 5, when the organic light-emitting device is on the thin film transistor 210, the planarization layer 170 may planarize the upper portion of the thin film transistor 210. The planarization layer 170 may include, for example, an organic material such as acryl, benzocyclobutene (BCB), hexamethyldisiloxane (HMDSO), etc. In FIG. 5, the planarization layer 170 has a single-layered structure, but may be variously modified, e.g., the planarization layer 140 may have a multi-layered structure.

In the display area DA of the substrate 100, the display device 310 may be on the planarization layer 170. The display device 310 may be an organic light-emitting device including, for example, the pixel electrode 311, an opposite electrode 315, and an intermediate layer 313 between the pixel electrode 311 and the opposite electrode 315, the intermediate layer 313 including an emission layer.

The pixel electrode 311 is electrically connected to the thin film transistor 210 by contacting one of the source electrode 215a and the drain electrode 215b via the opening formed in the planarization layer 170, etc. as shown in FIG. 5. The pixel electrode 311 includes a light-transmitting conductive layer including a conductive oxide transmitting light, e.g., ITO, $In_2O_3$, or IZO, and a reflective layer including metal such as Al or Ag. For example, the pixel electrode 311 may have a triple-layered structure including ITO/Ag/ITO.

A pixel defining layer 175 may be on the planarization layer 170. The pixel defining layer 175 includes an opening corresponding to each sub-pixel, that is, an opening that exposes at least a center of the pixel electrode 311, to define pixels. Also, in the example as shown in FIG. 5, the pixel defining layer 175 increases a distance between an edge of the pixel electrode 311 and the opposite electrode 315 above the pixel electrode 311 to prevent or reduce generation of an arc at the edge of the pixel electrode 311. The pixel defining layer 175 may include, for example, an organic material such as polyimide, hexamethyldisiloxane (HMDSO), etc.

The intermediate layer 313 of the organic light-emitting diode may include a low-molecular weight organic material or a polymer material. When the intermediate layer 313 includes a low-molecular weight material, the intermediate layer 313 may include a hole injection layer (HIL), a hole transport layer (HTL), an emission layer (EML), an electron transport layer (ETL), and an electron injection layer (EIL) in a single or multiple-layered structure and may be obtained by a vacuum deposition method. When the intermediate layer 313 includes a polymer material, the intermediate layer 313 may include an HTL and an EML. Here, the HTL may include PEDOT, and the EML may include a poly-phenylenevinylene (PPV)-based or polyfluorene-based polymer material. The intermediate layer 313 may be arranged by using a screen printing method, an inkjet printing method, a laser induced thermal imaging (LITI) method, etc. However, the intermediate layer 313 is not limited thereto, and may have various structures. In addition, the intermediate layer 313 may include a layer formed integrally over the plurality of pixel electrodes 311 or may include a layer that is patterned to correspond to each of the plurality of pixel electrodes 311.

The opposite electrode 315 is arranged above the display area DA and may cover the display area DA. That is, the opposite electrode 315 may be integrally provided over the plurality of organic light-emitting diodes to correspond to a plurality of pixel electrodes 311. The opposite electrode 315 may include a light-transmitting conductive layer including ITO, $In_2O_3$, IZO, etc., and may include a semi-transmissive layer including metal such as Al, Ag, etc. For example, the opposite electrode 315 may include a semi-transmissive layer including MgAg.

Because the organic light-emitting device may be easily damaged due to external moisture or oxygen, an encapsulation layer may cover the organic light-emitting device to protect the organic light-emitting device. The encapsulation layer may cover the display area DA and may extend to at least a part of the peripheral area PA. The encapsulation layer may include a first inorganic encapsulation layer, an organic encapsulation layer, and a second inorganic encapsulation layer.

Figure 6:
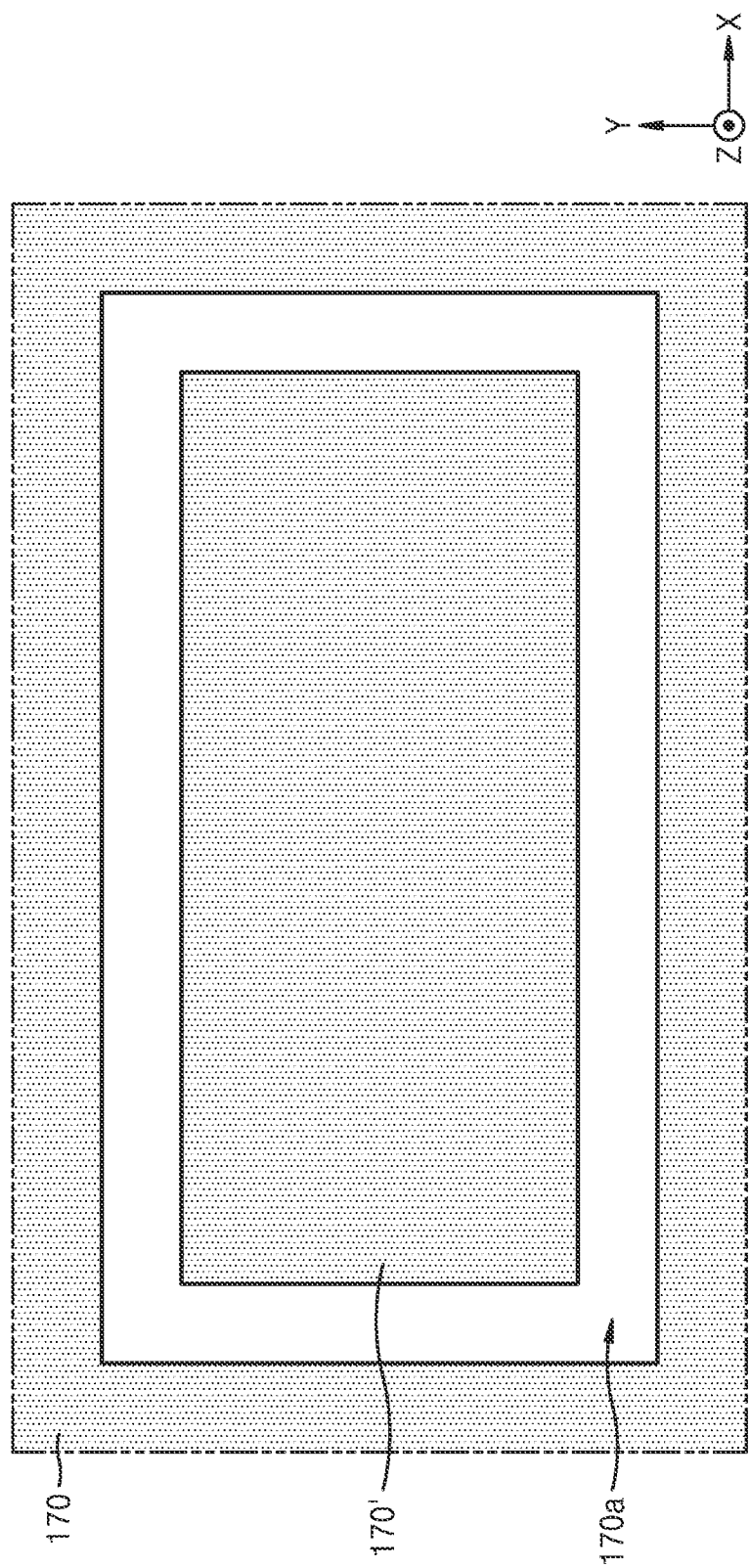
FIG. 6 is a plan view showing a portion of the display apparatus of FIG. 1 according to some embodiments.

In addition, as described above with reference to FIG. 2, etc., the planarization layer 170 that is the second insulating layer includes the opening 170a exposing the plurality of first pads 164, 165, and 166. The opening 170a may have various shapes, e.g., as shown in FIG. 6 that is a plan view showing a part of the display apparatus of FIG. 1, the opening 170a of the planarization layer 170 may have a loop shape when viewed from the direction perpendicular or normal to the upper surface of the substrate 100 (that is, in z-axis direction) (e.g., when viewed in a plan view). FIG. 6 shows that the opening 170a of the planarization layer 170 has a rectangular closed-loop shape when viewed from the direction perpendicular or normal to the upper surface of the substrate 100 (z-axis direction) (e.g., when viewed in a plan view). Accordingly, the planarization layer 170 may have an island portion 170' spaced apart (e.g., by the opening 170a) from the remaining portion of the planarization layer 170. The 1-2nd wiring W1-2 as described above may be under the island portion 170' of the planarization layer 170. Also, the 2-2nd wiring W2-2, as well as the 1-2nd wiring W1-2, may be under the island portion 170' of the planarization layer 170.

Figure 7:
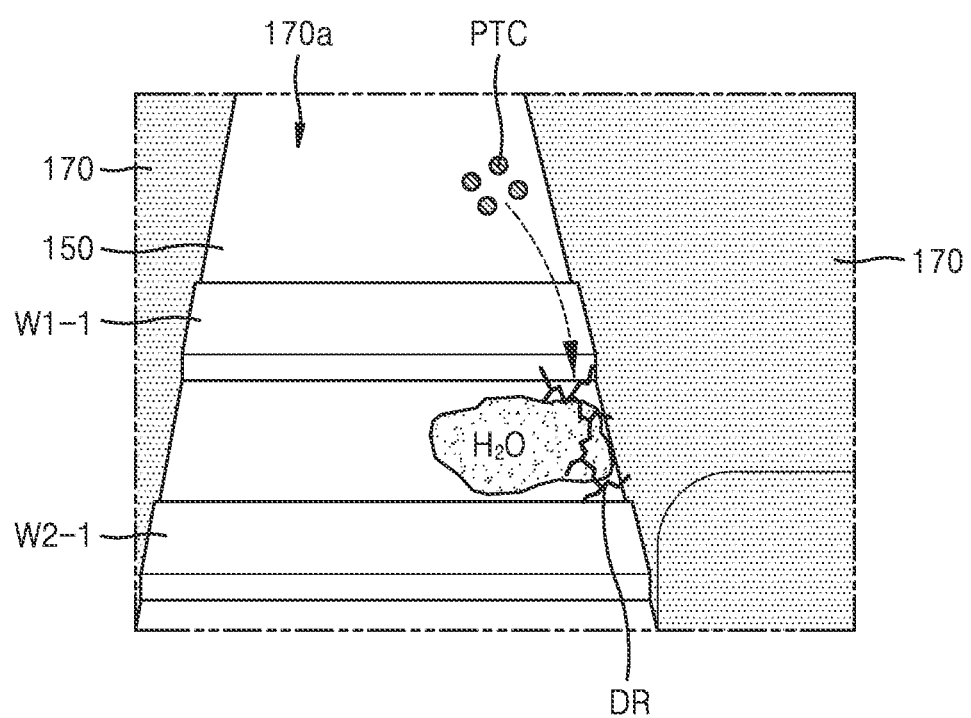
FIG. 7 is a perspective view showing a portion of a display apparatus according to a comparative example.

FIG. 7 is a perspective view showing a portion of a display apparatus according to a comparative example. In FIG. 7, the 1-1st wiring W1-1st and the 2-1st wiring W2-1 are not under the interlayer insulating layer 150, that is, the first insulating layer, but on the interlayer insulating layer 150. As a result, after forming the planarization layer 170 during the manufacturing processes, the 1-1st wiring W1-1st and the 2-1st wiring W2-1 are exposed to outside via the opening 170a of the planarization layer 170. In this case, particles PTC of a metal material such as argentum (Ag) may move into the opening 170a of the planarization layer 170 during the manufacturing processes. For example, the particles PTC may be relatively more concentrated on corners of the opening 170a by the second law of thermodynamics.

During the manufacturing processes, the display apparatus may be placed in a highly humid environment. In this case, when a potential difference occurs between the 1-1st wiring W1-1st and the 2-1st wiring W2-1, dendrite DR may be obtained from the particles PTC in the 1-1st wiring W1-1st or the 2-1st wiring W2-1. For example, in a case in which the particles PTC include argentum (Ag), when the potential difference occurs between the 1-1st wiring W1-1st and the 2-1st wiring W2-1 in the highly humid environment, silver dendrite DR may be generated in the 1-1st wiring W1-1st or the 2-1st wiring W2-1. Such above dendrite DR is electrically conductive, and thus, may generate shorts in the 1-1st wiring W1-1st and the 2-1st wiring W2-1 and cause defects in the display apparatus.

For example, when the pixel electrode 311 having the triple-layered structure including ITO/Ag/ITO is on the planarization layer 170, the particles PTC including argentum (Ag) may be obtained during the process of forming the pixel electrode 311, which may easily cause the generation of conductive dendrite DR. In addition, the potential difference between the 1-1st wiring W1-1st and the 2-1st wiring W2-1 may be generated during the process of inspecting defects in the display apparatus that is being manufactured by applying the electrical signal to the first wiring W1 and the second wiring W2, and thus, the conductive dendrite DR may be generated and cause defects in the display apparatus.

However, in the display apparatus according to some embodiments, the 1-1st wiring W1-1st and the 2-1st wiring W2-1 are under the interlayer insulating layer 150 and are not exposed to outside via the opening 170a of the planarization layer 170 on the interlayer insulating layer 150. Therefore, generation of the defects may be effectively prevented or reduced.

Figure 8:
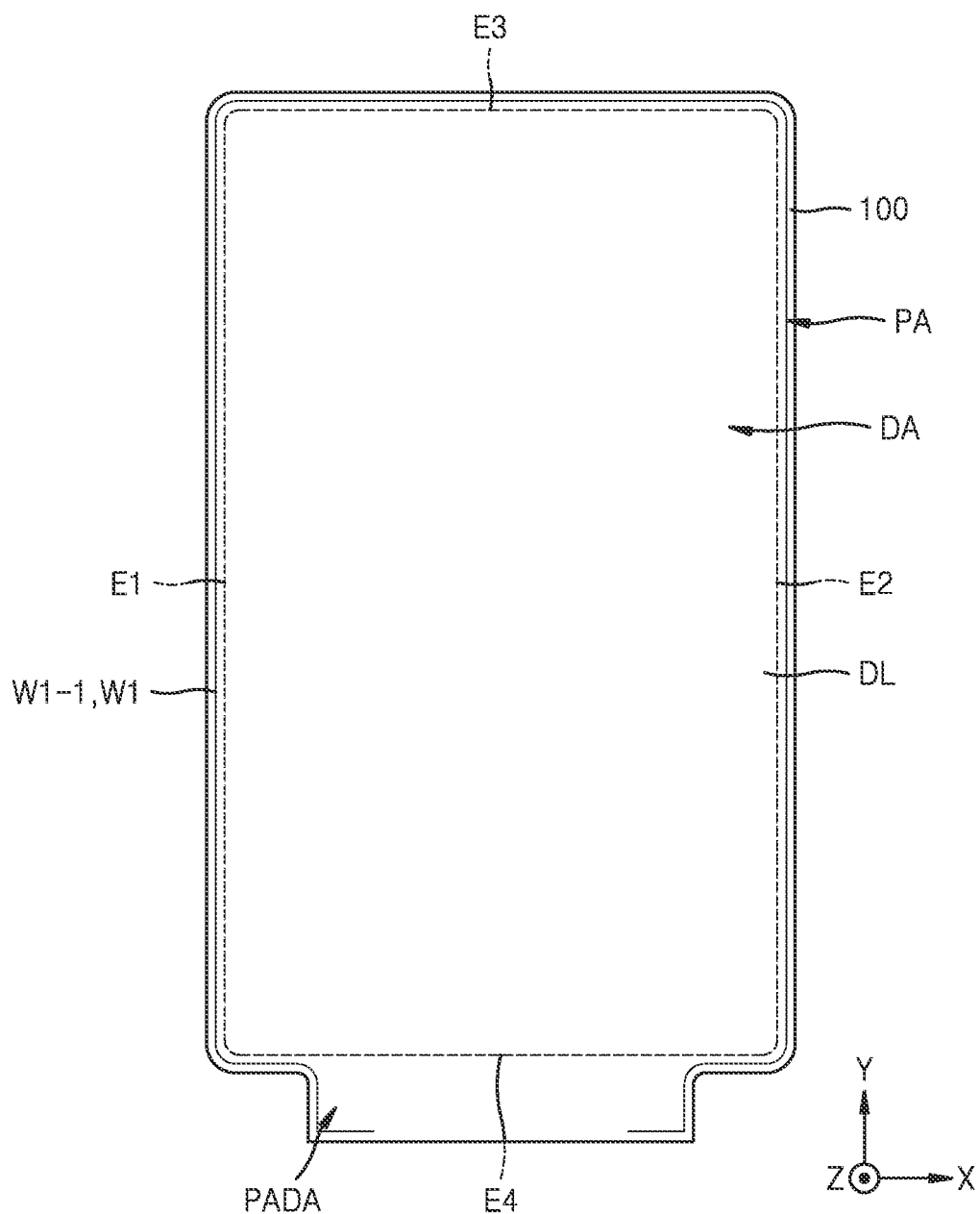
FIG. 8 is a plan view showing a portion of the display apparatus of FIG. 1.

In addition, as shown in FIG. 8 that is a plan view showing a part of the display apparatus of FIG. 1, the 1-1st wiring W1-1st included in the first wiring W1 may extend to surround the display area DA. The first wiring W1 may be used to check whether there is a crack in the display panel.

FIG. 2 shows region A of FIG. 1, and region B of FIG. 1 has a shape in which left and right sides of FIG. 2 are inverted. Therefore, the 1-1st wiring W1-1st surrounding the display area DA is electrically connected to the first pad 166-1 via the 1-2nd wiring W1-2 and the 1-3rd wiring W1-3 in the region A, and is also electrically connected to a pad in the region B. Therefore, an electrical signal is applied between the first pad 166-1, etc. in the region A and the corresponding pad in the region B and a voltage and/or a current is measured, and thus, it may be checked whether there is a crack generated in the display panel. When there is a crack in an edge of the display panel, the 1-1st wiring W1-1st is disconnected due to the crack, and accordingly, the electrical signal detected between the first pad 166-1, etc. in the region A and the corresponding pad in the region B is different from that detected in a normal case. After finishing the manufacturing of the display apparatus, a DC bias voltage is applied to the first wiring W1 from a power source of the display apparatus.

Moreover, when the DC bias voltage is applied to the first wiring W1 and a signal for checking a data line is applied to the second wiring W2, etc., a large potential difference occurs between the first wiring W1 and the second wiring W2. Therefore, as shown in FIG. 7, when the 1-1st wiring W1-1st and the 2-1st wiring W2-1 are on the interlayer insulating layer 150 and exposed to outside via the opening 170a of the planarization layer 170, the dendrite DR may be easily generated. However, in the display apparatus according to some embodiments, the 1-1st wiring W1-1st and the 2-1st wiring W2-1 are under the interlayer insulating layer 150 and are not exposed to outside via the opening 170a of the planarization layer 170 on the interlayer insulating layer 150. Therefore, generation of the defects may be effectively prevented or reduced.

Figure 9:
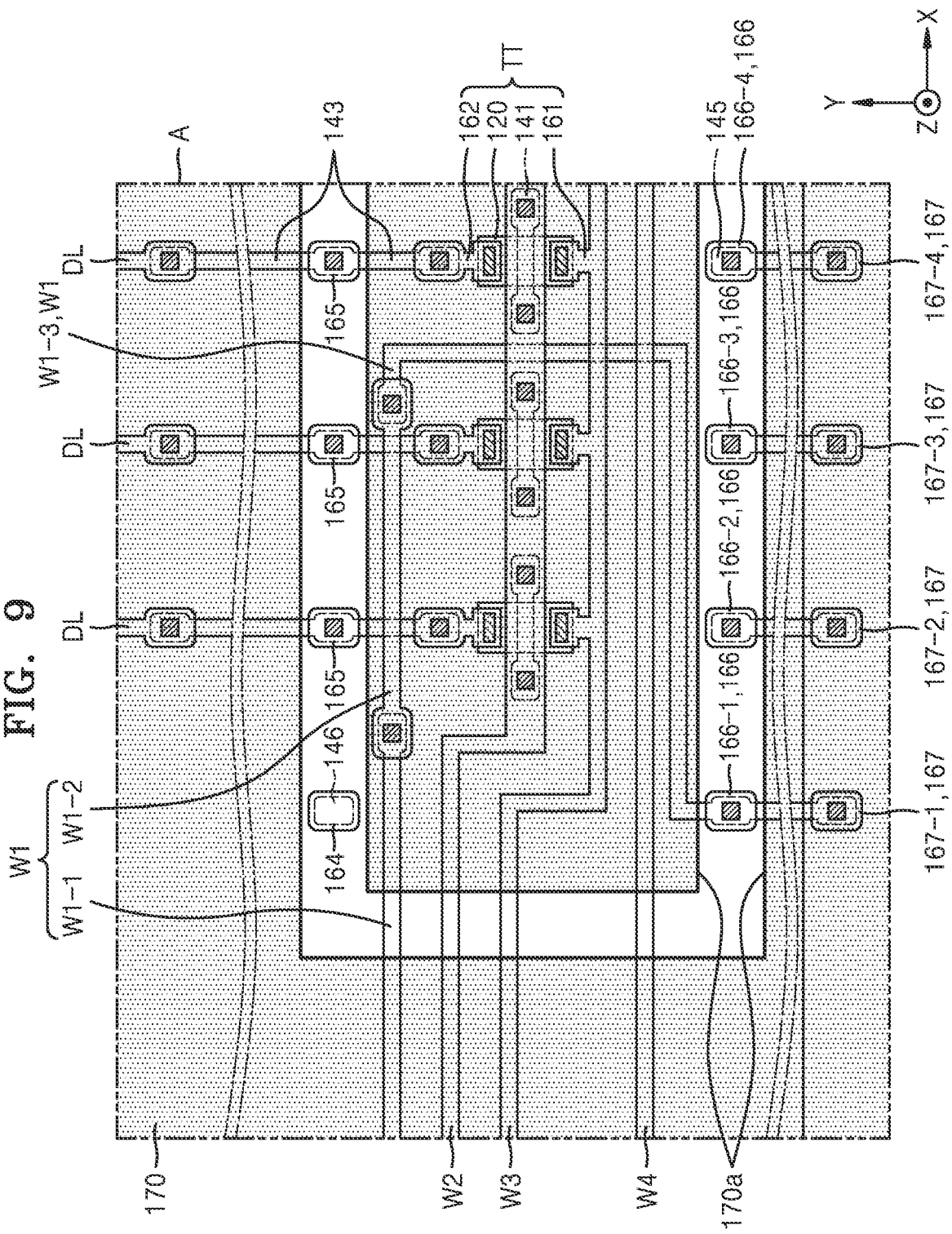
FIG. 9 is a plan view showing a portion of a display apparatus according to some embodiments.

FIG. 9 is a plan view showing a portion of a display apparatus according to some embodiments. The display apparatus according to some embodiments as illustrated in FIG. 9 is different from the display apparatus according to the above embodiments described above with reference to FIG. 2, etc. in view of structures of the second wiring W2, the third wiring W3, and the fourth wiring W4.

The first wiring W1 has the same structure as that of the first wiring W1 in the display apparatus described above with reference to FIG. 2, etc. However, the second wiring W2, the third wiring W3, and the fourth wiring W4 in the display apparatus according to some embodiments are between the interlayer insulating layer 150, that is, the first insulating layer, and the planarization layer 170, that is, the second insulating layer. That is, the second wiring W2, the third wiring W3, and the fourth wiring W4 are on the interlayer insulating layer 150, that is, the first insulating layer. In addition, the second to fourth wirings W2, W3, and W4 are located in the peripheral area PA of the substrate 100 across the opening 170a of the planarization layer 170 that is the second insulating layer, when viewed from the direction perpendicular or normal to the upper surface of the substrate 100 (z-axis direction) (e.g., when viewed in a plan view). This may be understood that, in the above embodiments described with reference to FIG. 2, etc., the 2-1st wiring W2-1 and the 2-2nd wiring W2-2 are integrally formed and located on the interlayer insulating layer 150, the 3-1st wiring W3-1 and the 3-2nd wiring W3-2 are integrally formed and located on the interlayer insulating layer 150, and the 4-1st wiring W4-1 and the 4-2nd wiring W4-2 are integrally formed and located on the interlayer insulating layer 150. Accordingly, the second wiring W2, the third wiring W3, and the fourth wiring W4 are exposed by the opening 170a of the planarization layer 170. Here, the 1-1st wiring W1-1st has a portion that is parallel to at least a part of each of the second wiring W2, the third wiring W3, and/or the fourth wiring W4, as shown in FIG. 9.

As described above with reference to FIG. 7, the dendrite DR may be generated and shorts may occur in the wirings exposed by the opening 170a of the planarization layer 170. The dendrite DR is easily generated as the potential difference between the wirings increases. Therefore, even when the wirings are exposed by the opening 170a of the planarization layer 170, the dendrite DR may not be generated or less generated provided that the potential difference between the wirings is not large. Therefore, a possibility of generating defects such as shorts is low between the wirings.

As described above, the first wiring W1 having the 1-1st wiring W1-1st extending to surround the display area DA is a wiring for checking whether there is a crack in the display panel, and the second wiring W2, the third wiring W3, and the fourth wiring W4 are configured to apply test signals to the data lines DL. Due to the above difference, the potential difference between the first wiring W1 and the second wiring W2 is relatively large, but the potential difference among the second wiring W2, the third wiring W3, and the fourth wiring W4 is relatively small.

Because the potential difference among the second wiring W2, the third wiring W3, and the fourth wiring W4 is not large, dendrite DR may not be generated or a very small amount of dendrite DR is generated among the second wiring W2, the third wiring W3, and the fourth wiring W4, and accordingly, a possibility of generating shorts among the second wiring W2, the third wiring W3, and the fourth wiring W4 is very low. Therefore, even when the second wiring W2, the third wiring W3, and the fourth wiring W4 are exposed through the opening 170a of the planarization layer 170 as shown in FIG. 9, there may be no defect. Moreover, in the display apparatus according to some embodiments, a portion of the first wiring W1, which crosses the opening 170a of the planarization layer 170, is the 1-1st wiring W1-1st and is under the interlayer insulating layer 150. Thus, even when dendrite DR is generated in the second wiring W2 due to the large potential difference between the first wiring W1 and the second wiring W2, defects such as shorts may not be generated or may be reduced between the first wiring W1 and the second wiring W2.

As described above, the second, third, and fourth wirings W2, W3, and W4 are configured to apply test signals to the data lines DL. Therefore, they may be collectively referred to as a plurality of second wirings for convenience of description.

Figure 10:
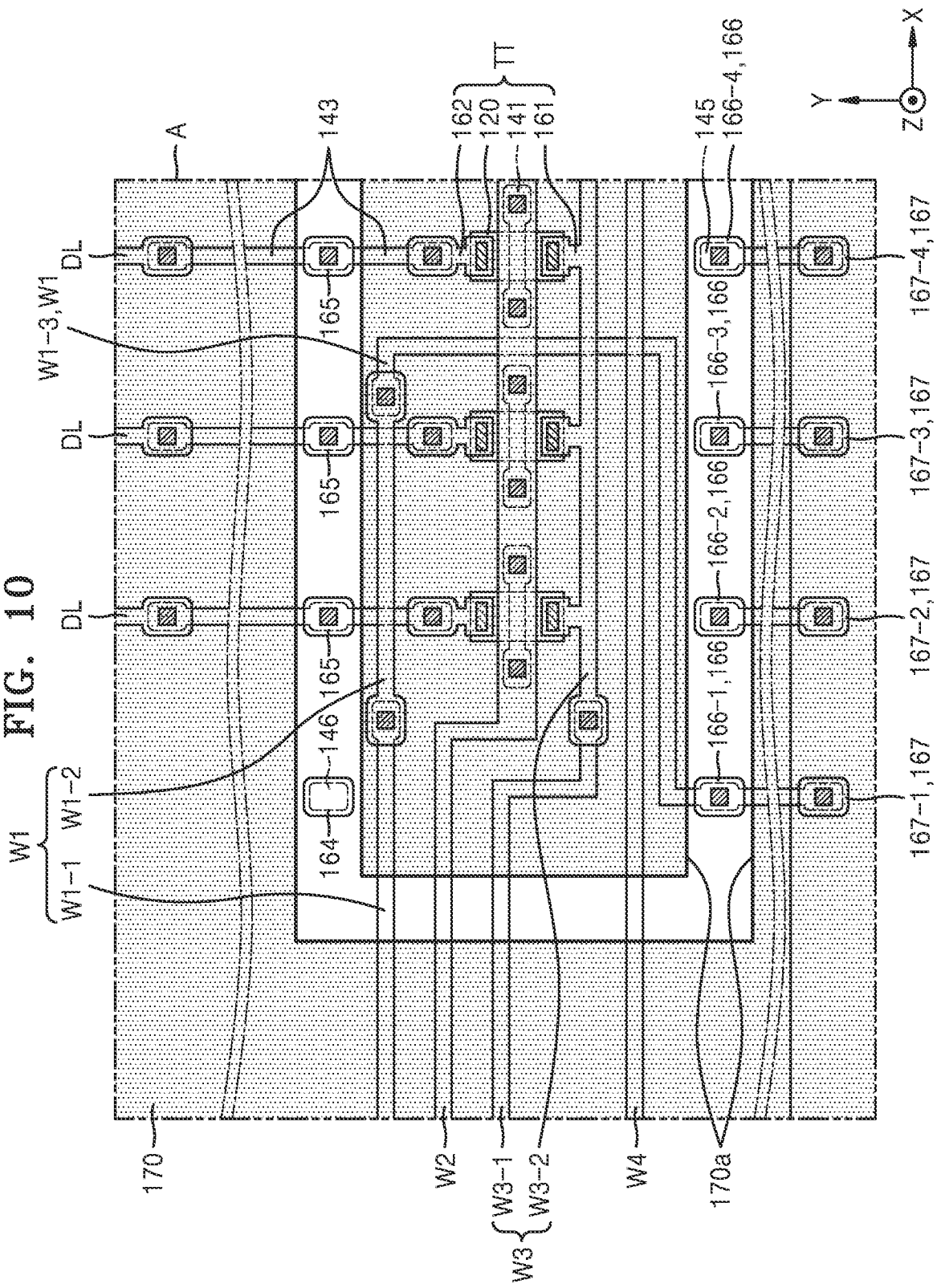
FIG. 10 is a plan view showing a portion of a display apparatus according to some embodiments.

FIG. 10 is a plan view showing a portion of a display apparatus according to some embodiments. The display apparatus according to the embodiments described with respect to FIG. 10 is different from the display apparatus according to the embodiments described above with reference to FIG. 2 in view of the structures of the second wiring W2 and the fourth wiring W4.

The first wiring W1 and the third wiring W3 have the same structures as those of the first wiring W1 and the third wiring W3 in the display apparatus described above with reference to FIG. 2. However, the second wiring W2 and the fourth wiring W4 in the display apparatus according to some embodiments are between the interlayer insulating layer 150, that is, the first insulating layer, and the planarization layer 170, that is, the second insulating layer. That is, the second wiring W2 and the fourth wiring W4 are on the interlayer insulating layer 150, that is, the first insulating layer. In addition, the second and fourth wirings W2 and W4 are located in the peripheral area PA of the substrate 100 across the opening 170a of the planarization layer 170 that is the second insulating layer, when viewed from the direction perpendicular or normal to the upper surface of the substrate 100 (z-axis direction) (e.g., when viewed in a plan view). This may be understood that, in the above embodiments described with reference to FIG. 2, etc., the 2-1st wiring W2-1 and the 2-2nd wiring W2-2 are integrally formed and located on the interlayer insulating layer 150, and the 4-1st wiring W4-1 and the 4-2nd wiring W4-2 are integrally formed and located on the interlayer insulating layer 150. Accordingly, the second wiring W2 and the fourth wiring W4 are exposed by the opening 170a of the planarization layer 170. Here, the 1-1st wiring W1-1st has a portion that is parallel to at least a part of each of the second wiring W2, the 3-1st wiring W3-1, as shown in FIG. 10.

As described above with reference to FIG. 7, dendrite DR may be generated and shorts may occur in the wirings exposed by the opening 170a of the planarization layer 170. However, in the display apparatus according to some embodiments, a portion of the first wiring W1, which crosses the opening 170a of the planarization layer 170, is the 1-1st wiring W1-1st and is under the interlayer insulating layer 150. Thus, even when dendrite DR is generated in the second wiring W2 due to the large potential difference between the first wiring W1 and the second wiring W2, defects such as shorts may not be generated between the first wiring W1 and the second wiring W2.

In addition, because the potential difference between the second wiring W2 and the third wiring W3 is not large, dendrite DR may not be generated or a very small amount of dendrite DR may be generated. However, in the display apparatus according to some embodiments, even when a large amount of dendrite DR is generated between the second wiring W2 and the third wiring W3, defects caused by the dendrite DR may not occur. A portion of the third wiring W3, crossing the opening 170a of the planarization layer 170, is the 3-1st wiring W3-1, and is located under the interlayer insulating layer 150. Therefore, even when dendrite DR is generated in the second wiring W2, defects such as shorts may not occur between the second wiring W2 and the third wiring W3. This may be also applied between the third wiring W3 and the fourth wiring W4. As a reference, although the second wiring W2 and the fourth wiring W4 are both exposed by the opening 170a of the planarization layer 170, the second wiring W2 and the fourth wiring W4 are far from each other, and thus, even when the dendrite DR is generated in the second wiring W2 and/or the fourth wiring W4, a possibility of generating shorts between the second wiring W2 and the fourth wiring W4 is very low.

Figure 11:
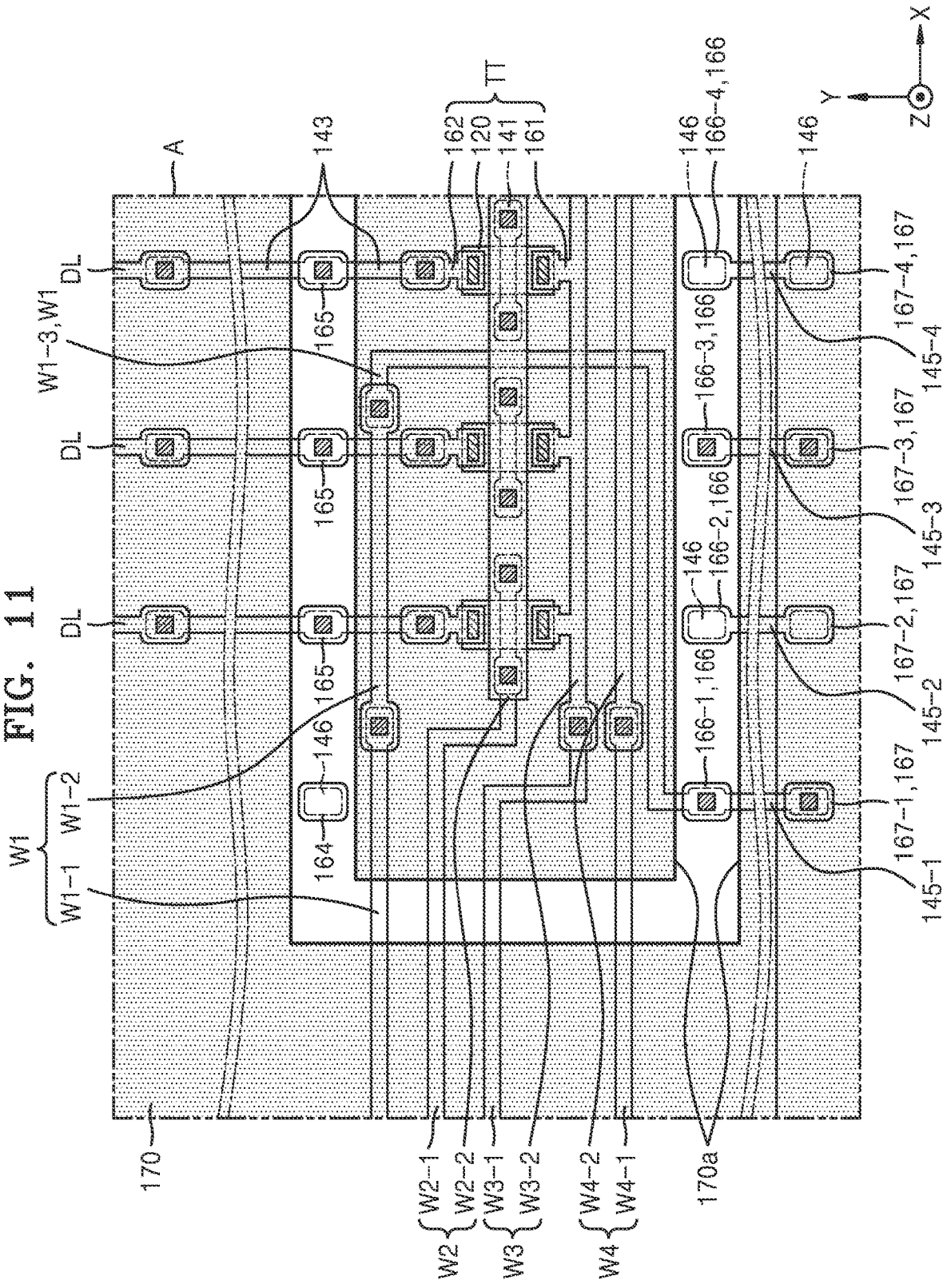
FIG. 11 is a plan view showing a portion of a display apparatus according to some embodiments.

In the embodiments, the connecting lines 145 are under the interlayer insulating layer 150. Therefore, even when the particles PTC (see FIG. 7) exist around the edge of the opening 170a of the planarization layer 170, dendrite is not formed in the connecting lines 145 covered by the interlayer insulating layer 150. Moreover, as shown in FIG. 11 that is a plan view showing a portion of the display apparatus according to some embodiments, the connecting lines 145 electrically connecting the second pads 167 to the corresponding first pads 166 may have different shapes from those of the connecting lines 145 in the above-described embodiments. In this case, generation of defects in the connecting lines 145 may be effectively reduced.

For example, from among the connecting lines 145, a connecting line 145-1 is under the first pad 166-1 and the second pad 167-1 and is in contact with the first pad 166-1 and the second pad 167-1 via the contact holes in the interlayer insulating layer 150 to electrically connect the first pad 166-1 to the second pad 167-1. A connecting line 145-3 is also under the first pad 166-3 and the second pad 167-3 and is in contact with the first pad 166-3 and the second pad 167-3 via the contact holes in the interlayer insulating layer 150 to electrically connect the first pad 166-3 to the second pad 167-3. The first pad 166-1, the first pad 166-3, the second pad 167-1, the second pad 167-3, the connecting line 145-1, and the connecting line 145-3 may have the same shapes as those in the embodiments described above with reference to FIG. 2, etc.

On the other hand, a connecting line 145-2 from among the connecting lines 145 may be at the same layer as that of a first pad 166-2 and a second pad 167-2 and may be integrally provided with the second pads 166-2 and 167-2. A connecting line 145-4 may be at the same layer as that of a first pad 166-4 and a second pad 167-4 and may be integrally provided with the first and second pads 166-4 and 167-4. That is, the connecting line 145-2 and the connecting line 145-4 are on the interlayer insulating layer 150 and exposed by the opening 170a of the planarization layer 170. Therefore, dendrite DR may be generated in the connecting lines 145-2 and 145-4.

However, the connecting line 145-2 exposed by the opening 170a of the planarization layer 170 is under the interlayer insulating layer 150 and between the connecting line 145-1 and the connecting line 145-3 that are not exposed by the opening 170a of the planarization layer 170, when viewed from the direction perpendicular or normal to the upper surface of the substrate 100 (z-axis direction) (e.g., when viewed in a plan view). In addition, the connecting line 145-3 that is not exposed by the opening 170a of the planarization layer 170 is between the connecting line 145-2 and the connecting line 145-4 that are exposed by the opening 170a of the planarization layer 170. Therefore, generation of shorts between the adjacent connecting lines may be effectively prevented or reduced.

The step adjusting portion 146 is under the first pad 166-2 and the first pad 166-4 in the direction toward the substrate 100, and thus, a height from the bottom surface of the substrate 100 to an upper surface of the first pad 166-2 and a height from the bottom surface of the substrate 100 to an upper surface of the first pad 166-4 may be similar to or the same as a height from the bottom surface of the substrate 100 to an upper surface of the first pad 166-1, under which the connecting line 145-1 is located. Therefore, the driving chip 180 (see FIG. 3) may be stably positioned.

Figure 12:
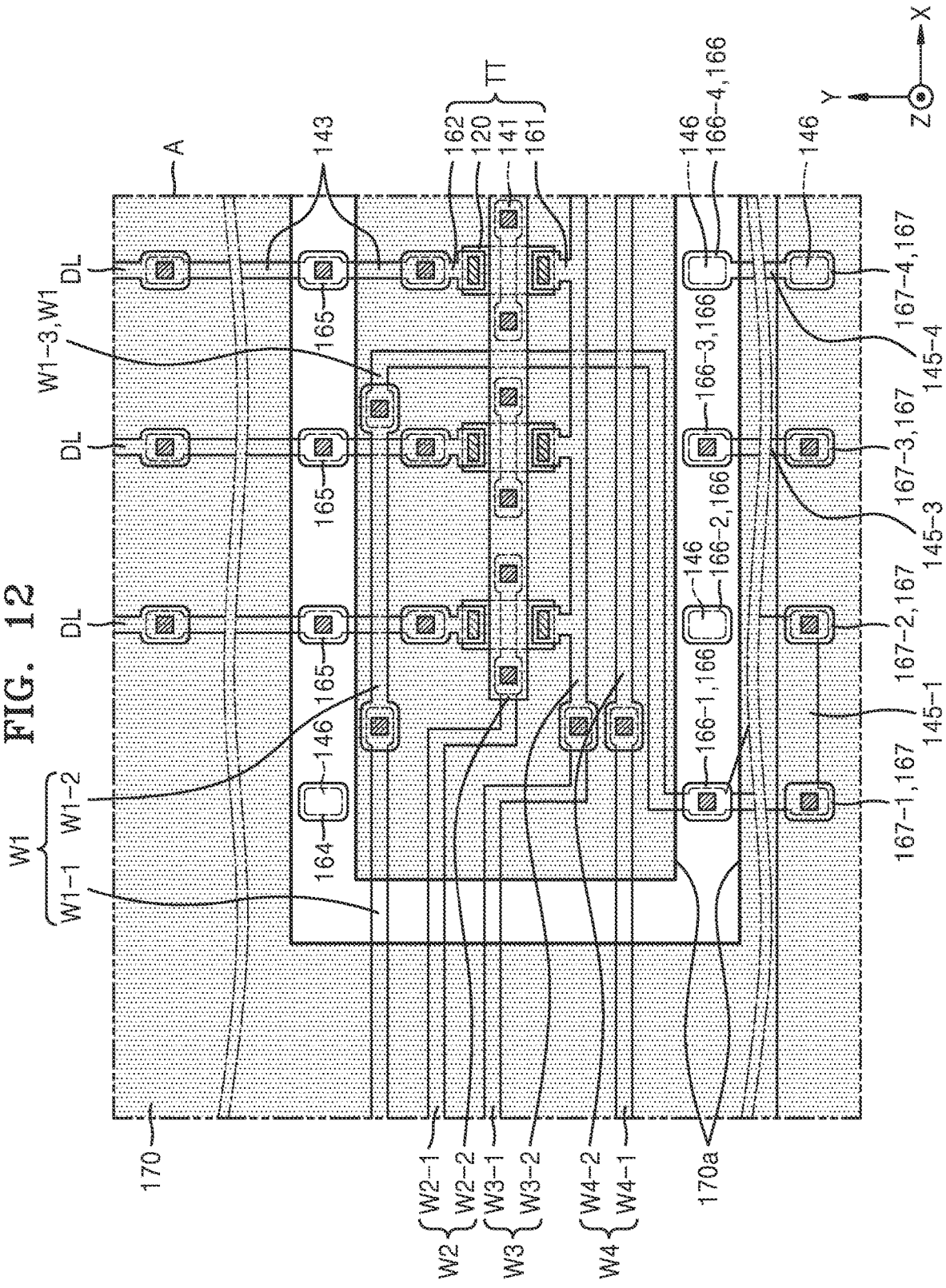
FIG. 12 is a plan view showing a portion of a display apparatus according to some embodiments.

In FIG. 2, etc., one connecting line 145 connects one of the first pads 166 to a corresponding one of the second pads 167, but embodiments according to the present disclosure are not limited thereto. For example, as shown in FIG. 12 that is a plan view showing a portion of a display apparatus according to some embodiments, one connecting line 145-1 may connect one first pad 166-1 to two second pads 167-1 and 167-2.

According to the one or more embodiments, the display apparatus in which generation of defects in the wirings, etc. may be reduced during the manufacturing processes may be implemented. However, the scope of embodiments according to the present disclosure is not limited to the above characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
   a substrate comprising a display area and a peripheral area outside the display area;
   a first insulating layer covering the peripheral area;
   a plurality of first pads on the first insulating layer in the peripheral area;
   a second insulating layer on the first insulating layer in the peripheral area, the second insulating layer having an opening exposing the plurality of first pads; and
   a first wiring comprising a 1-1st wiring and a 1-2nd wiring, wherein, the 1-1st wiring is under the first insulating layer such that, in a plan view, the 1-1st wiring completely crosses the opening of the second insulating layer in the peripheral area, the 1-2nd wiring is electrically connected to the 1-1st wiring outside the opening in the second insulating layer in the plan view, and the 1-2nd wiring is completely overlapped by the second insulating layer in the plan view and is between the first insulating layer and the second insulating layer.

2. The display apparatus of claim 1, wherein the plurality of first pads and the 1-2nd wiring include a same material.

3. The display apparatus of claim 1, wherein the plurality of first pads and the 1-2nd wiring have a same layered structure.

4. The display apparatus of claim 1, further comprising a second wiring comprising a 2-1st wiring and a 2-2nd wiring,
   wherein, in the plan view, the 2-1st wiring is under the first insulating layer to cross the opening of the second insulating layer in the peripheral area, the 2-2nd wiring is electrically connected to the 2-1st wiring outside the opening in the second insulating layer, and the 2-2nd wiring is between the first insulating layer and the second insulating layer.

5. The display apparatus of claim 4, wherein the 1-1st wiring includes a portion parallel to at least a part of the 2-1st wiring.

6. The display apparatus of claim 4, wherein the 1-1 st wiring extends from a pad area, around the display area, and back to the pad area.

7. The display apparatus of claim 4, further comprising data lines crossing the display area,
   wherein the 2-2nd wiring is configured to apply a test signal to the data lines.

8. The display apparatus of claim 1, further comprising a plurality of second wirings between the first insulating layer and the second insulating layer,
   wherein, in the plan view, the plurality of second wirings cross the opening of the second insulating layer in the peripheral area of the substrate.

9. The display apparatus of claim 8, wherein the 1-1st wiring includes a portion parallel to at least a part in each of the plurality of second wirings.

10. The display apparatus of claim 8, wherein the 1-1st wiring extends from a pad area, around the display area, and back to the pad area.

11. The display apparatus of claim 8, further comprising data lines crossing the display area,
    wherein the plurality of second wirings are configured to apply test signals to the data lines.

12. The display apparatus of claim 1, further comprising:
    a second wiring between the first insulating layer and the second insulating layer, wherein, in the plan view, the second wiring crosses the opening of the second insulating layer in the peripheral area; and
    a third wiring comprising a 3-1st wiring and a 3-2nd wiring, wherein, in the plan view, the 3-1st wiring is under the first insulating layer to cross the opening of the second insulating layer in the peripheral area of the substrate, the 3-2nd wiring is electrically connected to the 3-1st wiring outside the opening in the second insulating layer, and the 3-2nd wiring is between the first insulating layer and the second insulating layer.

13. The display apparatus of claim 12, wherein the 1-1st wiring includes a portion parallel to at least a part in each of the second wiring and the 3-1st wiring.

14. The display apparatus of claim 12, wherein the 1-1 st wiring extends from a pad area, around the display area, and back to the pad area.

15. The display apparatus of claim 12, further comprising data lines crossing the display area,
    wherein the second wiring and the third wiring are configured to apply test signals to the data lines.

16. The display apparatus of claim 1, wherein, in the plan view, the opening of the second insulating layer has a loop shape.

17. The display apparatus of claim 16, wherein, in the plan view, the 1-2nd wiring is under an island shape portion of the second insulating layer, the island shape portion being defined by the opening of the second insulating layer.

18. The display apparatus of claim 1, further comprising:
    a plurality of second pads on the first insulating layer in the peripheral area of the substrate; and
    connecting lines connecting some of the plurality of first pads to the plurality of second pads and located under the first insulating layer.

19. The display apparatus of claim 1, further comprising:
    a plurality of second pads on the first insulating layer in the peripheral area of the substrate;
    a first connecting line connecting a 1-1st pad from among the plurality of first pads to a 2-1st pad from among the plurality of second pads, and located under the first insulating layer; and
    a second connecting line connecting a 1-2nd pad from among the plurality of first pads to a 2-2nd pad from among the plurality of second pads, and located between the first insulating layer and the second insulating layer.

20. The display apparatus of claim 19, further comprising:
    a third connecting line connecting a 1-3rd pad from among the plurality of first pads to a 2-3rd pad from among the plurality of second pads, and located under the first insulating layer,
    wherein, in the plan view, the second connecting line is between the first connecting line and the third connecting line.

21. The display apparatus of claim 20, further comprising a fourth connecting line connecting a 1-4th pad from among the plurality of first pads to a 2-4th pad from among the plurality of second pads, and located between the first insulating layer and the second insulating layer,
    wherein, in the plan view, the third connecting line is between the second connecting line and the fourth connecting line.

* * * * *